United States Patent
Cordes et al.

(10) Patent No.: US 7,277,338 B2
(45) Date of Patent: Oct. 2, 2007

(54) METHOD AND DEVICE FOR TESTING SEMICONDUCTOR MEMORY DEVICES

(75) Inventors: Eric Cordes, Chapel Hill, NC (US); Christian Stocken, Munich (DE); Georg Erhard Eggers, Munich (DE); Jens Luepke, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 506 days.

(21) Appl. No.: 10/487,255

(22) PCT Filed: Aug. 21, 2002

(86) PCT No.: PCT/DE02/03058

§ 371 (c)(1),
(2), (4) Date: Oct. 27, 2004

(87) PCT Pub. No.: WO03/021604

PCT Pub. Date: Mar. 13, 2003

(65) Prior Publication Data

US 2005/0057988 A1 Mar. 17, 2005

(30) Foreign Application Priority Data

Aug. 21, 2001 (DE) ............................... 101 40 986

(51) Int. Cl.
*G11C 7/00* (2006.01)

(52) U.S. Cl. ..................................... 365/201; 365/193
(58) Field of Classification Search ................ 365/201, 365/193
See application file for complete search history.

(56) References Cited

U.S. PATENT DOCUMENTS

| 6,195,616 | B1 | 2/2001 | Reed et al. | ................ 702/119 |
| 6,339,555 | B1 * | 1/2002 | Hamada et al. | ............ 365/201 |

FOREIGN PATENT DOCUMENTS

WO    WO 02/39459 A2    5/2002

OTHER PUBLICATIONS

Article by Christof Windeck: Dopplereffekt. In: c't Magazin fur Computertechnik, Heft 23, Nov. 2000, S. 162-166.
German Office Action dated Jul. 26, 2002.

* cited by examiner

*Primary Examiner*—Anh Phung
*Assistant Examiner*—N Nguyen
(74) *Attorney, Agent, or Firm*—Slater & Matsil, L.L.P.

(57) ABSTRACT

A test method for a semiconductor memory device having a bidirectional data strobe terminal for a data strobe signal, and having at least one data terminal for a data signal at a test apparatus, which can at least generate data strobe and data signals and also transfer and evaluate data signals. The memory device is connected to a test apparatus, which generates data strobe and data signals, and transfers and evaluates data signals. In the course of the test using the data strobe and data signals, data are transferred from the first semiconductor memory device to a second semiconductor memory device of identical type and are evaluated after a read-out from the second semiconductor memory device by the test apparatus.

16 Claims, 2 Drawing Sheets

US 7,277,338 B2

METHOD AND DEVICE FOR TESTING SEMICONDUCTOR MEMORY DEVICES

BACKGROUND

1. Field of the Invention

The invention relates to semiconductor measurements and more particularly to a method and a device for the measurement of a semiconductor memory device having a bidirectional data strobe terminal for a data strobe signal and having at least one data terminal for a data signal at a test apparatus.

2. Background of the Invention

Semiconductor memory devices are tested at test apparatuses which generally have a plurality of identical test heads which each have a plurality of test locations for semiconductor memory devices that are to be tested (also referred to herein as "devices under test"). Each test location has, inter alia, outputs (hereinafter "drivers"), and also bidirectional inputs and outputs (hereinafter "I/O ports") for outputting and for receiving data signals.

The number of I/O ports per test location is limited and, in test apparatuses for conventional semiconductor memory devices, is based on the number of data terminals of the semiconductor memory devices. Therefore, it is generally a multiple of eight or twelve. Given maximum occupancy of a test head, all of the I/O ports of a test head are regularly used.

In the course of the test, the data signals output by the test apparatus via I/O ports transfer data to the device under test, while the data signals output via data terminals of the device under test transfer data to the test apparatus. In this case, the transfer and the evaluation of the data signals received by the test apparatus are always produced in a manner synchronized with an internal clock of the test apparatus.

Semiconductor memory devices of a newer type may also have newer architecture that comprises, in addition to the bidirectional data terminals, at least one further bidirectional terminal for a data strobe signal (data strobe terminal) operated in parallel with the data signals. The data strobe signal is output (hereinafter also: "driven") by the semiconductor memory device during the read-out of data from the semiconductor memory device and by a memory control device (hereinafter "memory controller") during the writing of data to the semiconductor memory device. Such a signal may serve for controlling or synchronizing write and read operations (also termed "data transfer" hereinafter).

During the testing of such semiconductor memory devices of a newer type which have a bidirectional data strobe terminal serving for synchronizing or controlling the data transfer, using a conventional test apparatus, that is, one designed for testing conventional semiconductor memory devices, problems arise with regard to the number of available I/O ports per test location and the testing of time conditions (hereinafter "timing") of the data strobe signal.

During the read-out of data from the device under test, the test apparatus instigates the read operation and evaluates the data signals present at the I/O ports in a manner synchronized to the read operation using an internal clock of the test apparatus itself. However, if the device under test has a data strobe signal of the above-mentioned type, the evaluation of the data signals, in the case of complete testing or testing close to the application, has to be performed in a manner synchronized with the data strobe signal, which, in general, does not depend on the clock signal of the test apparatus. However, test apparatuses designed for conventional semiconductor memory devices are not designed to measure devices where the clock signal is synchronized to the device strobe signal.

The second problem relates to the resources of the test apparatus. The maximum number of possible test locations (and thus also devices under test) per test head generally results directly from the total number of I/O ports on a test head and the number of bidirectional terminals on a device under test. In the case of semiconductor memory devices of a conventional type, only data terminals are regularly bidirectional, and are generally provided in a multiple of eight or twelve in accordance with the customary data bus width. Accordingly, the total number of I/O ports is also a multiple of eight or twelve. Furthermore, the I/O ports are organized electrically, mechanically and in terms of programming, into units compatible with the data bus width and are limited in terms of their assignability to the test locations.

An additional bidirectional terminal on the semiconductor memory device reduces the number of devices under test which can be tested in a given test pass at the test apparatus, since the additionally required I/O port for the data strobe signal can only be made available by a second test location. Since the second test location is then not only blocked for accommodating a further device under test but, moreover, due to the organization of the test apparatus, is also unsuitable for making available I/O ports for other devices under test on the common test head, the number of devices under test per test pass is ultimately reduced by half.

In will therefore be appreciated that a need exists to improve test methods for newer types semiconductor memory devices.

SUMMARY

Embodiments of the present invention provide a test method in which the timing of an additional data strobe signal is tested in conjunction with data signals. An exemplary embodiment of the present invention provides a test method for a first semiconductor memory device having a bidirectional data strobe terminal used for a data strobe (DQS) signal and at least one bidirectional data terminal used for data signals (DQ). The memory device is connected to at a test apparatus (PA), which generates data strobe and data signals, and transfers and evaluates data signals. In the course of the test using the data strobe and data signals, data are transferred from the first semiconductor memory device (P) to a second semiconductor memory device (R) of identical type used as a reference, and are evaluated after a read-out from the second semiconductor memory device (R) by the test apparatus (PA).

Another exemplary embodiment of the present invention includes a test device for facilitating testing of a first semiconductor memory device that contains a bidirectional data strobe terminal at least one bidirectional data terminal. The test device contains a switching device (SV), which connects the data strobe and data terminals of the first and the second semiconductor memory device respectively either to a test apparatus or via a respective connection to the corresponding terminal of the respective other semiconductor memory device.

DETAILED DESCRIPTION OF THE PREFERRED EMBODIMENTS

The following list of reference symbols is used consistently in the discussion to follow.
P Device under test
R Reference
PA Test apparatus
SV Switching device
SPDQS Switching unit with respect to DQS at the device under test
SRDQS Switching unit with respect to DQS at the reference
SPDQ Switching units with respect to DQ at the device under test
SRDQ Switching units with respect to DQ at the reference
RK Quiescent contact
AK Operating contact
SK Switching contact
V Delay line
$t_{Clk}$ Period duration of the clock signal CLK
$t_V$ Delay time of the delay line
$\Delta t_{DQ}$ Time offset of DQ at the reference
$\Delta t_{DQS}$ Time offset of DQS at the reference
CMD Signals at the control terminals
ADR Signals at the address terminals
Y Column address of the test data
DQ Signal DQ
DQS Signal DQS
READ Y Control signal for read-out (of the device under test)
WRITE Y Control signal for writing (of the reference)

Figure 1:
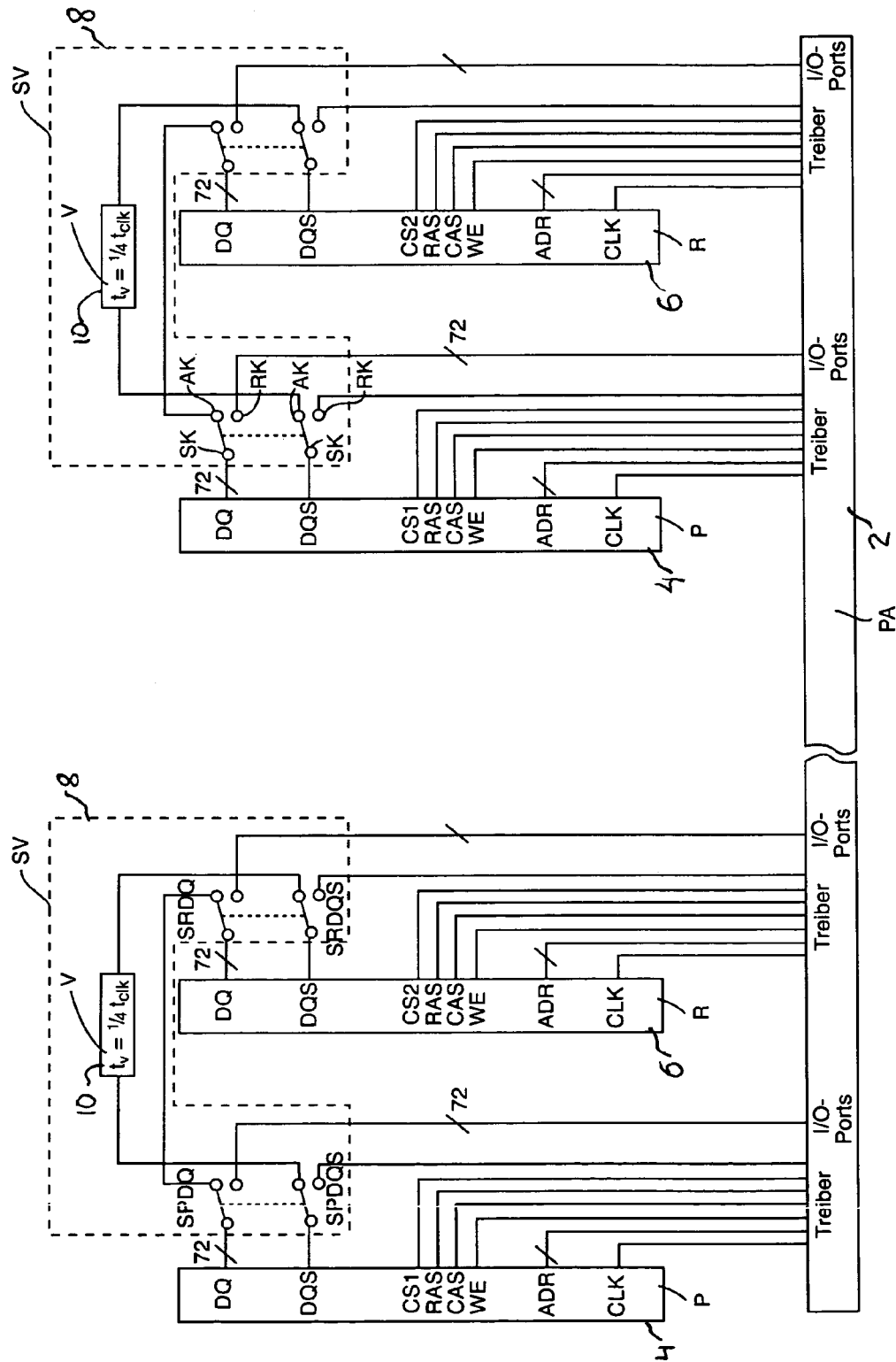
FIG. 1 shows a schematic illustration of a device according to the invention in a particularly preferred embodiment.

FIG. 1 shows a test apparatus (PA) 2 and two pairs of semiconductor memory devices to be tested, each comprising a device under test (P) 4 and a reference (R) 6. In this case, the restriction to two pairs imparts clarity to the illustration. Device under test 4 and reference 6 are depicted as DDR-DRAMs in this case. In a preferred embodiment of the present invention, the control inputs of the DDR-DRAMs of which CS, RAS, CAS, WE, ADR and CLK are illustrated here, are connected to the drivers of the PA, and the seventy two data (DQ) terminals and the data query strobe (DQS) terminal are connected to a switching device (SV) 8.

SV 8 comprises switching units, in this case relays with quiescent, operating and switching contacts (RK, AK, SK), with each DQ terminal and the DQS terminal, in each case of device under test 4 and of reference 6, connected to the switching contacts SK of the switching units SPDQ, SRDQ, SPDQS and SRDQS, respectively. The quiescent contacts RK of the switching units SPDQ and SRDQ are connected to I/O ports of the test apparatus PA and the quiescent contacts of the switching units SPDQS and SRDQS are connected to a respective driver of the test apparatus PA. The contacts of the relays are depicted in the operating state. The illustration of the relay driving was dispensed with for reasons of clarity.

The operating contacts of the switching units SPDQ are connected to those of the switching units SRDQ, and the operating contact of the switching unit SPDQS is connected to that of the switching unit SRDQS via a delay line having the delay time $\tfrac{1}{4}t_{Clk}$.

During a test, the devices under test 4 and the references 6 are firstly tested in terms of their functionality, as far as possible in the same way as conventional DRAMs with the switching units SPDQS, SRDQS, SPDQ and SRDQ in the quiescent position. This may perfectly well also comprise writing to and reading from the DDR-DRAMs. Only the evaluation of DQS during the read-out of the data from the DDR-DRAMs is initially not possible.

To that end, a test pattern is written to the devices under test 4 and a reference pattern, which can be distinguished therefrom, is written to the references 6. Afterward, all the switching units in the switching device SV are changed over. As a result, DQS and DQ are isolated from the test apparatus and instead respectively corresponding DQ terminals and the DQS terminals in each case of a device under test 4 and of a reference 6 are connected to one another, DQS being delayed between device under test and reference by $\tfrac{1}{4}t_{Clk}$. Subsequently, a read cycle is initiated on the devices under test and, at a suitable time interval with respect thereto, a write cycle is initiated on the references 6, whereupon the test pattern is subsequently transferred from the devices under test 4 to the references 6. Subsequently, the connections between the devices under test and the references are disconnected again and instead the DQS and DQ terminals thereof are connected to the test apparatus.

Finally, the test apparatus reads out the data from the references. Since the latter expect a valid DQS for reading-in data, the test pattern and not the reference pattern is to be read out from them only when the associated device under test 4 has output a valid signal at DQS during the data transfer.

Figure 2:
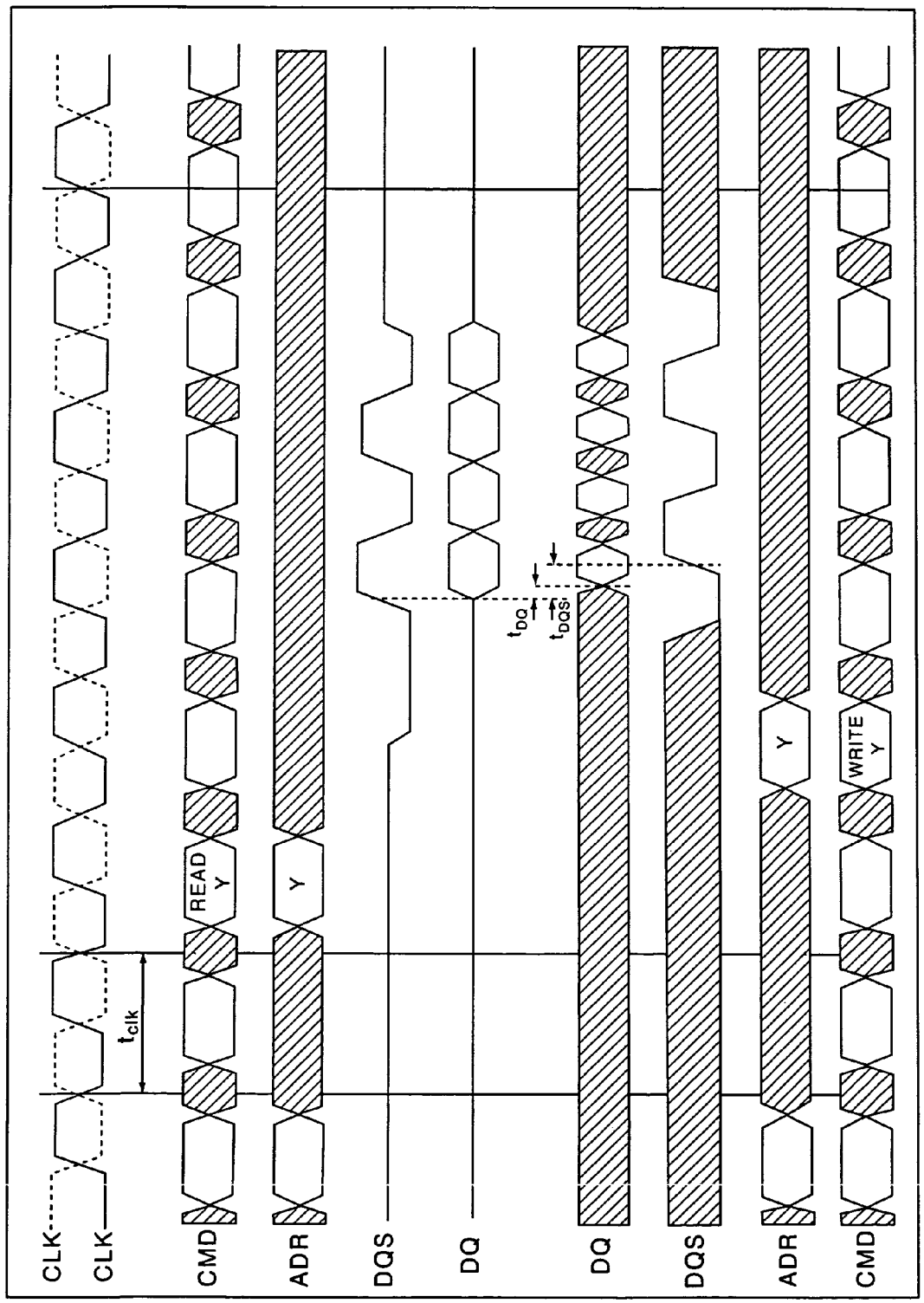
FIG. 2 shows a schematic timing diagram for signals at a device under test and a reference during the data transfer.

FIG. 2 shows the sequence of a data transfer from a device under test 4 to a reference 6 through illustration of the time profiles of the common clock signals (CLK, INVCLK), the control, address and DQ signals (CMS, ADR, DQ) and the DQS signal (DQS), in accordance with an embodiment of the present invention. In each case the device under test 4 is at the top and reference 6 at the bottom. A control command READ Y on CMD instigates the read-out of the data from an address Y on ADR from the device under test, and a control command WRITE Y following the next rising edge at CLK instigates a write operation in the reference. The time offset $\Delta t_{DQS}$ between the DQS at the device under test and the DQS at the reference is about $\tfrac{1}{4}t_{Clk}$. A small time offset $\Delta t_{DQ}$ between the DQ at the device under test and the DQ at the reference results from a minimum length of the connection between the DQ terminals of the device under test and of the reference.

The evaluation of the data strobe signal of the first semiconductor memory device (the device under test) is thus left to the second semiconductor memory device (the reference). This is possible since each semiconductor memory device has the internal elements necessary to evaluate the data and data strobe signals and also their correct temporal sequence with respect to one another.

Since the data strobe signal is only driven, but not evaluated, by the test apparatus, the data strobe line no longer has to be connected to an I/O port, but rather can be connected to a simple driver of the test apparatus. Thus, it is possible to test as many semiconductor memory devices of a new type that contain data strobe lines, as those of a conventional type for a given test pass or test head size.

Thus, the present invention provides improved methods to test semiconductor devices of a new type, including those with data strobe terminals. The semiconductor memory device of a new type that is to be tested (the device under test) is connected to the test apparatus for testing semiconductor memory devices of the conventional type at a test location like such an otherwise identical semiconductor memory device of a conventional type, the bidirectional data strobe terminal of the device under test being connected to a driver of the same test location directly or via a switching device controlled by the test apparatus. The device under test is then subjected to a test sequence corresponding to that for semiconductor memory devices of a conventional type, during which the test apparatus generates the data strobe signal via the driver during the writing of data in a suitable manner.

After the first part of the test sequence, the device under test is completely tested apart from the evaluation of the data strobe signal during the read-out of data from the device under test.

In order to test the data strobe signal during the read-out of data from the device under test with regard to valid signal levels and temporal position with respect to the data signals, the procedure is as follows:

Test data are written to the device under test to at least one test data address, and reference data which can be distinguished from the test data are written to the reference at the test data address. The data and data strobe terminals of the device under test and of the reference are then disconnected from the test apparatus and connected to one another instead by means of a switching device controlled by the test apparatus. Subsequently, the test apparatus initiates firstly a read operation at the device under test and, at a suitable time interval—prescribed by the timing specifications of the semiconductor memory device—following the read operation, a write operation at the reference, that is to say, a data transfer of the test data from the device under test to the reference at the test data address of the test and reference data. After the data transfer, the data terminals of the reference are disconnected from the device under test and are connected to the test apparatus. The test apparatus then reads out the data at the test data address.

The test data can be read out from the reference only when a correct data strobe signal has been driven by the device under test during the data transfer from the device under test to the reference. Otherwise, the unchanged reference data are read out from the reference.

The data strobe and data lines are changed over by means of switching devices (e.g., relays, FETs) controlled by the test apparatus.

A previously tested semiconductor memory device of the same type that is contained in the abovementioned switching device may respectively be used as a reference for each device under test. In this case, the reference is a constituent part of the switching device and remains so while new devices under test are always mounted at the test location for test purposes. Surplus drivers of the test location are used for driving the reference, while the I/O ports of the test location are alternately connected to the device under test or to the reference.

Preferably, however, a second device under test on the same test apparatus, particularly preferably on the same test head, is used as the reference. In the case where the test head is occupied by an even number of devices under test, the devices under test are divided into two groups, PG and RG. Firstly, the devices under test in the group PG are tested with the devices under test in the group RG used as reference. Thereafter, the devices under test in the group RG are tested with those in the group PG used as reference.

The test method according to embodiments of the present invention can particularly preferably be applied to semiconductor memory devices with a double data rate interface (DDR-IF) in accordance with a JEDEC standard. The DDR interface is customarily employed nowadays, particularly on DRAMs.

In contrast to conventional synchronous semiconductor memory devices, in which write and read accesses take place in each case at the rising or falling edge of a clock signal, in semiconductor memory devices with DDR-IF a data transfer is possible both upon the rising and upon the falling edge of the clock signal, thus resulting in an approximate doubling of the possible data transfer rate for a given clock frequency. However, rather than the clock signal (CLK), a "data query strobe" (DQS) signal derived therefrom is used for the synchronization of the actual data transfer between semiconductor devices with DDR-IF. DQS corresponds to a data strobe signal which is generated by the semiconductor memory device during the reading of data from a semiconductor memory device like the data signals, and by a memory controller during the writing of data to the semiconductor memory device like the data signals.

During the writing of data to the semiconductor memory device with DDR-IF, DQS is controlled in such a way that each edge of DQS indicates the center of a transferred data bit at DQ. The semiconductor memory device with DDR-IF accepts the data on DQ in each case at the instant of an edge at DQS.

During reading from the DDR-IF semiconductor memory device, DQS is generated edge-synchronously with the data DQ. The memory controller expects the data on the data lines after each edge at DQS.

Thus, it is necessary to unambiguously define the propagation times of DQ and DQS during the data transfer between device under test and reference by means of delay devices, in order to actually enable a correct data transfer in the first place or to test the timing between DQ and DQS with regard to a sufficient margin.

Monostable multivibrators, bucket-brigade devices or delay lines are taken into consideration as delay devices.

The connecting line between the DQS terminal of the device under test and that of the reference may contain further devices which serve to test the DQS signal under intensified conditions, for instance through a lowering of the signal level of DQS.

Equally, it is possible to equip the semiconductor memory devices with suitable circuits and functions for the application of the test method according to the present invention.

In a test mode of the semiconductor memory device, it is possible for instance to reduce the time window for write access in the reference and thus to improve the test severity for the timing of the data strobe and data signals output by the device under test.

In the same test mode, delay devices fabricated in the semiconductor memory devices themselves may furthermore be connected into the relevant signal lines.

The delay devices can be made using delay lines, without thereby restricting the test method according to the present invention or the arrangement according to the present invention to this particular embodiment.

In a particularly preferred embodiment of the present invention, DQS is only tested close to the application, without further margins. For this purpose, DQS is delayed using delay device (V) 10 between the device under test and the reference by ¼ of the period duration of CLK or DQS ($t_{Clk}/4$) with respect to the DQS at the output of the device under test. In this embodiment of the invention, DQS at the reference is no longer edge-synchronous with CLK. The length of a simple delay line is about 0.5 m in this case.

In another embodiment, DQS is delayed by a whole period duration of CLK ($t_{Clk}$). DQS thus remains edge-synchronous with CLK. Since DQS has to lead the data by ¼$t_{Clk}$, all DQ are delayed by ¾$t_{Clk}$. A disadvantage compared with the previous embodiment is that all DQ have to be provided with delay lines, and also the requisite lengths of about 1.5 m for DQ and above 2 m for DQS.

In another embodiment, instead of CLK, the inverted clock signal INVCLK is connected to the reference, whereby DQS at the reference has to be delayed only by $½t_{Clk}$ and DQ correspondingly has to be delayed only by $¼t_{Clk}$. Compared with the previous embodiment, although the delay line length is reduced, the outlay rises due to the clock signal control on the test head being no-longer uniform.

A device of the type according to the invention is preferably suitable for all test apparatuses, designed for testing semiconductor memory devices without a data strobe terminal.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A test method for a first semiconductor memory device having a bidirectional data strobe terminal for a data strobe signal (DQS) and at least one bidirectional data terminal for data signals (DQ), the method comprising:
   providing a test apparatus (PA) capable of generating data strobe and data signals and transferring and evaluating data signals in the course of a test using the data strobe and data signals;
   transferring data from the first semiconductor memory device to a second semiconductor memory device of identical type used as a reference; and
   evaluating the data after a read-out from the second semiconductor memory device by the test apparatus (PA).

2. The method of claim 1, further comprising:
   transferring data from the second semiconductor memory device to the first semiconductor memory device; and
   evaluating the data after a read-out from the first semiconductor memory device by the test apparatus.

3. The method of claim 1, wherein the data signals are DQ signals, and wherein the data strobe signal is a DQS signal of a DDR interface in accordance with a JEDEC standard.

4. The method of claim 1, wherein the second semiconductor memory device is operated in a test mode during the data transfer from the first to the second semiconductor memory device, and wherein a permitted time window for write accesses is reduced during test mode.

5. The method of claim 1, wherein one of the first and second semiconductor memory devices is operated in a test mode during the data transfer from the first to the second semiconductor memory device and the data strobe signal is delayed in the test mode.

6. The method of claim 1, wherein a delay device, which delays the data strobe signal by ¼ of the duration of a period of the data strobe signal, is provided in a connection between the data strobe terminals of the first and second semiconductor memory devices.

7. The method of claim 1, wherein a first delay device is provided in the connection between the data strobe terminals of the first and second semiconductor memory devices, wherein the delay device delays the data strobe signal by the duration of a whole period of the data strobe signal, and wherein second delay devices, which delay the corresponding data signal by ¾ of the period duration of the data strobe signal, are respectively provided in the connections between corresponding data terminals of the first and second semiconductor memory devices.

8. The method of claim 1, wherein a delay device is provided in the connection between the data strobe terminals of the first and second semiconductor memory devices and said delay device delays the data strobe signal by half the duration of a period of the data strobe signal,
   wherein connections between corresponding data terminals of the first and second semiconductor memory devices respectively have delay devices that delay the corresponding data signal by ¼ of the period duration of the data strobe signal, and
   wherein two semiconductor memory devices are connected to mutually inverted clock signals.

9. The method of claim 1, wherein the first and second semiconductor memory device are DDR-DRAMs or devices that contain DDR-DRAMs.

10. The method of claim 9, wherein a DDR interface in accordance with a JEDEC standard is situated on the first and second semiconductor memory device.

11. A device for facilitating measurement of a first semiconductor memory device, which has a bidirectional data strobe terminal and at least one bidirectional data terminal, at a test apparatus that generates data strobe and data signals and transfers and evaluates data signals, the device comprising:
   a switching device that connects the data strobe and data terminals of the first semiconductor memory device and a second semiconductor memory device respectively either to the test apparatus or via a respective connection to the corresponding terminal of the respective other semiconductor memory device.

12. The device of claim 11, further comprising:
   a delay device residing in the connection between the data strobe terminals of the first and second semiconductor memory devices, wherein the delay device delays the data strobe signal by ¼ of the duration of a period of the data strobe signal.

13. The device of 11, further comprising:
   a delay device residing in the connection between the data strobe terminals of the first and second semiconductor memory devices, wherein the delay device delays the data strobe signal by the duration of a whole period of the data strobe signal; and
   delay devices residing in the connections between corresponding data terminals of the first and second semiconductor memory devices, wherein the delay devices delay the corresponding data signal by ¾ of the period duration of the data strobe signal.

14. The device of claim 11, further comprising:
a delay device residing in the connection between the data strobe terminals of the first and second semiconductor memory devices, wherein the delay device delays the data strobe signal by half the duration of a period of the data strobe signal; and
delay devices residing in the connections between corresponding data terminals of the first and second semiconductor memory devices, wherein the delay devices delay the corresponding data signal by ¼ of the period duration of the data strobe signal.

15. The device of claim 11, wherein the first and second semiconductor memory devices are DDR-DRAMs semiconductor memory devices or include semiconductor memory devices.

16. The device of claim 11, wherein the test apparatus is designed for conventional semiconductor memory devices absent a data strobe terminal.

* * * * *